(12) United States Patent
Choi et al.

(10) Patent No.: US 11,004,675 B2
(45) Date of Patent: May 11, 2021

(54) SUBSTRATE CLEANING COMPOSITION, SUBSTRATE TREATING METHOD, AND SUBSTRATE TREATING APPARATUS

(71) Applicant: SEMES CO., LTD., Cheonan-si (KR)

(72) Inventors: Hae-Won Choi, Daejeon (KR); Ki-Moon Kang, Yongin-si (KR); Kihoon Choi, Cheonan-si (KR); Anton Koriakin, Cheonan-si (KR); Chan Young Heo, Hwaseong-si (KR); Jaeseong Lee, Hwaseong-si (KR); Kwon Taek Lim, Busan (KR); Yong Hun Kim, Busan (KR); Sang Ho Lee, Busan (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 158 days.

(21) Appl. No.: 16/129,089

(22) Filed: Sep. 12, 2018

(65) Prior Publication Data

US 2019/0080902 A1 Mar. 14, 2019

(30) Foreign Application Priority Data

Sep. 14, 2017 (KR) .................. 10-2017-0117829
Sep. 6, 2018 (KR) .................. 10-2018-0106336

(51) Int. Cl.
| | |
|---|---|
| *C11D 7/36* | (2006.01) |
| *H01L 21/02* | (2006.01) |
| *B08B 3/08* | (2006.01) |
| *C09K 13/08* | (2006.01) |
| *H01L 21/67* | (2006.01) |
| *C11D 7/34* | (2006.01) |
| *C11D 11/00* | (2006.01) |

(Continued)

(52) U.S. Cl.
CPC .......... *H01L 21/02101* (2013.01); *B08B 3/08* (2013.01); *C09K 13/08* (2013.01); *C11D 7/34* (2013.01); *C11D 7/36* (2013.01); *C11D 7/5022* (2013.01); *C11D 11/0047* (2013.01); *H01L 21/6719* (2013.01); *H01L 21/67028* (2013.01); *H01L 21/67051* (2013.01); *H01L 21/68764* (2013.01)

(58) Field of Classification Search
CPC .................................. C11D 11/0047
USPC ....................................... 510/175
See application file for complete search history.

(56) References Cited

U.S. PATENT DOCUMENTS

2009/0286188 A1* 11/2009 Hatakeyama et al. ...................... C11D 11/0047
510/175

FOREIGN PATENT DOCUMENTS

| | | |
|---|---|---|
| JP | 2008-530796 A | 8/2008 |
| JP | 2012-246474 A | 12/2012 |
| KR | 1019960034386 A | 3/2003 |

(Continued)

OTHER PUBLICATIONS

Notice of Allowance for Korean Application No. 10-2018-0106336 dated Aug. 20, 2020.

*Primary Examiner* — Gregory E Webb
(74) *Attorney, Agent, or Firm* — Harness, Dickey & Pierce, P.L.C.

(57) ABSTRACT

Disclosed are an anhydrous substrate cleaning composition, a substrate treating method, and a substrate treating apparatus. The anhydrous substrate cleaning composition includes an etching composite that provides fluorine, a solvent that dissolves the etching composite, and a binder that is a composite including phosphorous.

17 Claims, 11 Drawing Sheets

(51) Int. Cl.
   *H01L 21/687*   (2006.01)
   *C11D 7/50*   (2006.01)

(56) References Cited

FOREIGN PATENT DOCUMENTS

KR    10-2005-0005400 A    1/2005
   KR    10-2005-0063720 A    6/2005
   KR    10-1590897 B1    2/2016
   KR    10-2018-0036263 A    4/2018

\* cited by examiner

FIG. 9
| | HF/H2O | IPA | Tris(2-butoxyethyl) phosphate | Trimethyl phosphate | Optical Microscope Image |
|---|---|---|---|---|---|
| Comparison example 1 | - | 1 | 1 | - | 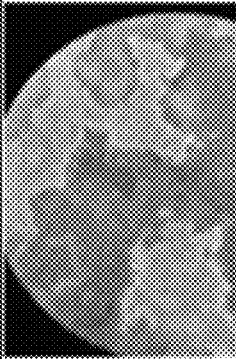 |
| Comparison example 2 | 1 | 20 | 10.5 | - | 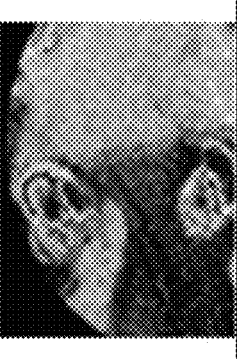 |
| Embodiment 1 | - | 1 | - | 1 | 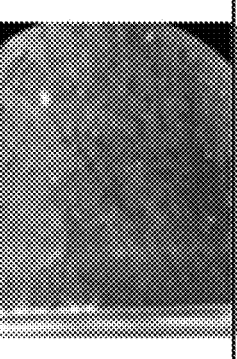 |
| Embodiment 2 | 1 | 20 | - | 10.5 | 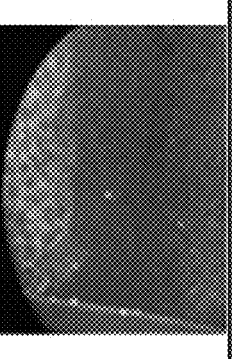 |

FIG. 10

| | HF/H2O | IPA | Optical Microscope Image | SEM Image | PRE(%) |
|---|---|---|---|---|---|
| Embodiment 3 | 1 | 25 | | | 50 |
| Embodiment 4 | 1 | 10 | | | 90 |

FIG. 11

| | HF/H2O | IPA | Optical Microsope Image | SEM Image | PRE(%) |
|---|---|---|---|---|---|
| Embodiment 6 | 20 | 1 | | - | 75 |
| Embodiment 7 | 10 | 1 | | | 78 |
| Embodiment 8 | 5 | 1 | | | 80 |
| Embodiment 9 | 1 | 1 | | | 85 |

SUBSTRATE CLEANING COMPOSITION, SUBSTRATE TREATING METHOD, AND SUBSTRATE TREATING APPARATUS

CROSS-REFERENCE TO RELATED APPLICATIONS

This application claims priority under 35 U.S.C. § 119 to Korean Patent Application No. 10-2017-0117829 filed on Sep. 14, 2017; and Korean Patent Application No. 10-2018-0106336 filed on Sep. 6, 2018, in the Korean Intellectual Property Office, the disclosures of which are incorporated by reference herein in their entireties.

BACKGROUND

Embodiments of the inventive concept described herein relate to a substrate cleaning composition, a substrate treating method, and a substrate treating apparatus.

A semiconductor device is manufactured via various processes, such as a photolithography process of forming a circuit pattern on a substrate such as a silicon wafer. In a process of manufacturing a semiconductor device, various foreign substances such as particles, organic contaminants, metal impurities are produced. The foreign substances cause defects in the substrate, acting as a factor that directly influences the performance and yield rate of the semiconductor device. Accordingly, the process of manufacturing the semiconductor device is essentially accompanied by a cleaning process for removing the foreign substances.

The cleaning process performed via a chemical process of removing foreign substances on a substrate, a washing process of washing a chemical with pure water, and a drying process of drying the substrate. The general drying process has been performed in a method of substituting pure water on a substrate with an organic solvent, such as isopropyl alcohol (IPA), which has a relatively low surface tension. Further, even though an organic solvent is used in the drying process, the semiconductor having a fine circuit pattern of a line width of 30 nm or less may undergo a pattern leaning and collapse.

SUMMARY

Embodiments of the inventive concept provide a substrate cleaning composition, a substrate treating method, and a substrate treating apparatus that may efficiently treat a substrate.

Embodiments of the inventive concept also provide a substrate cleaning composition, a substrate treating method, and a substrate treating apparatus having an improved cleaning efficiency.

Embodiments of the inventive concept also provide a substrate cleaning composition, a substrate treating method, and a substrate treating apparatus that may prevent a pattern collapse.

Embodiments of the inventive concept also provide an substrate cleaning composition, a substrate treating method, and a substrate treating apparatus capable of effectively removing particles having a size of nanoscale (100 nm or less).

In accordance with an aspect of the inventive concept, there is provided a substrate cleaning composition for treating a substrate comprising a co-solvent and a binder comprising a compound of [chemical formula 1: $O=P-(O-R)_3$, R: $CH_3-(CH_2)_{n-1}$, n: a natural number], dimethyl sulfite, diethyl sulfite, or a combination thereof.

The binder may be trimethyl phosphate.

The substrate cleaning composition may further comprise an etching compound including fluorine.

The etching compound may include hydrogen fluoride.

The co-solvent may be alcohol.

The co-solvent may be isopropyl alcohol, methanol, ethanol, or a combination thereof.

The weight percent of the co-solvent may be 45 to 97 wt %, and the weight percent of trimethyl phosphate may be 3 to 55 wt %.

The weight percent of the etching compound may be 0.1 to 1 wt %, the weight percent of the co-solvent may be 45 to 97 wt %, and the weight percent of the binder may be 3 to 55 wt %.

The weight percent of the etching compound may be less than 1 wt %, and the weight ratio of the co-solvent and the binder may be 1:1.

The substrate cleaning composition may remove particles of sizes of nanoscales (not more than 100 nm).

In accordance with another aspect of the inventive concept, there is provided a substrate cleaning composition that is mixed with a supercritical fluid to be supplied comprising the substrate cleaning composition is an anhydrous composition comprising a binder comprising a compound of chemical formula 1: $O=P-(O-R)_3$, R: $CH_3-(CH_2)_{n-1}$, n: a natural number], dimethyl sulfite, diethyl sulfite, or a combination thereof. The binder may be trimethyl phosphate.

The substrate cleaning composition may further comprise an etching compound including fluorine.

The etching composite may include hydrogen fluoride.

A co-solvent dissolving the binder may be alcohol.

The co-solvent dissolving the binder may be isopropyl alcohol, methanol, ethanol, or a combination thereof.

The weight percent of a co-solvent dissolving the binder may be 45 to 97 wt % and the weight percent of the binder may be 3 to 55 wt %.

The weight percent of the etching compound may be 0.1 to 1 wt %, the weight percent of a co-solvent dissolving the binder may be 45 to 97 wt %, and the weight percent of the binder may be 3 to 55 wt %.

The weight percent of the etching compound may be less than 1 wt %, and the weight ratio of the binder and a co-solvent dissolving the binder may be 1:1.

The substrate cleaning composition may remove particles of sizes of nanoscales (not more than 100 nm).

In accordance with another aspect of the inventive concept, there is provided a substrate treating method comprising supplying the substrate cleaning composition to a substrate, and treating the substrate by supplying a supercritical fluid to the substrate.

In accordance with another aspect of the inventive concept, there is provided a substrate treating apparatus comprising a chamber, a support unit located inside the chamber and configured to support a substrate, and a fluid supply unit configured to mix an substrate cleaning composite with a supercritical fluid and supply the mixture into the chamber, wherein the anhydrous substrate cleaning composition is the substrate cleaning composition.

The fluid supply unit may comprise a plurality of fluid supply ports connected to the chamber and configured to supply the cleaning composition and the supercritical fluid to an inner space of the chamber.

The fluid supply unit may comprise a fluid supply port connected to the chamber and configured to supply the substrate cleaning composition and the supercritical fluid to the interior space of the chamber, and a shower head located above the substrate in the interior space of the chamber and configured to distribute the cleaning composition and the supercritical fluid to the substrate.

BRIEF DESCRIPTION OF THE FIGURES

The above and other objects and features of the inventive concept will become apparent by describing in detail exemplary embodiments thereof with reference to the accompanying drawings.

FIG. 9 illustrates an experiment of identifying a performance of a substrate cleaning composition;

FIG. 10 compares performances while varying composition ratios of an HF solution and trimethyl phosphate; and FIG. 11 compares performances while varying composition ratios of an HF solution, IPA, and trimethyl phosphate.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Hereinafter, a substrate treating apparatus according to the inventive concept will be described.

The substrate processing apparatus may perform a supercritical process of processing a substrate by using a supercritical fluid as a process fluid.

Here, the substrate is an inclusive concept including a semiconductor device or a flat panel display (FPD), and other substrates used for manufacturing objects in which a circuit pattern is formed on a thin film. Examples of such substrates S include silicon wafers, glass substrates, and organic substrates.

Figure 1:
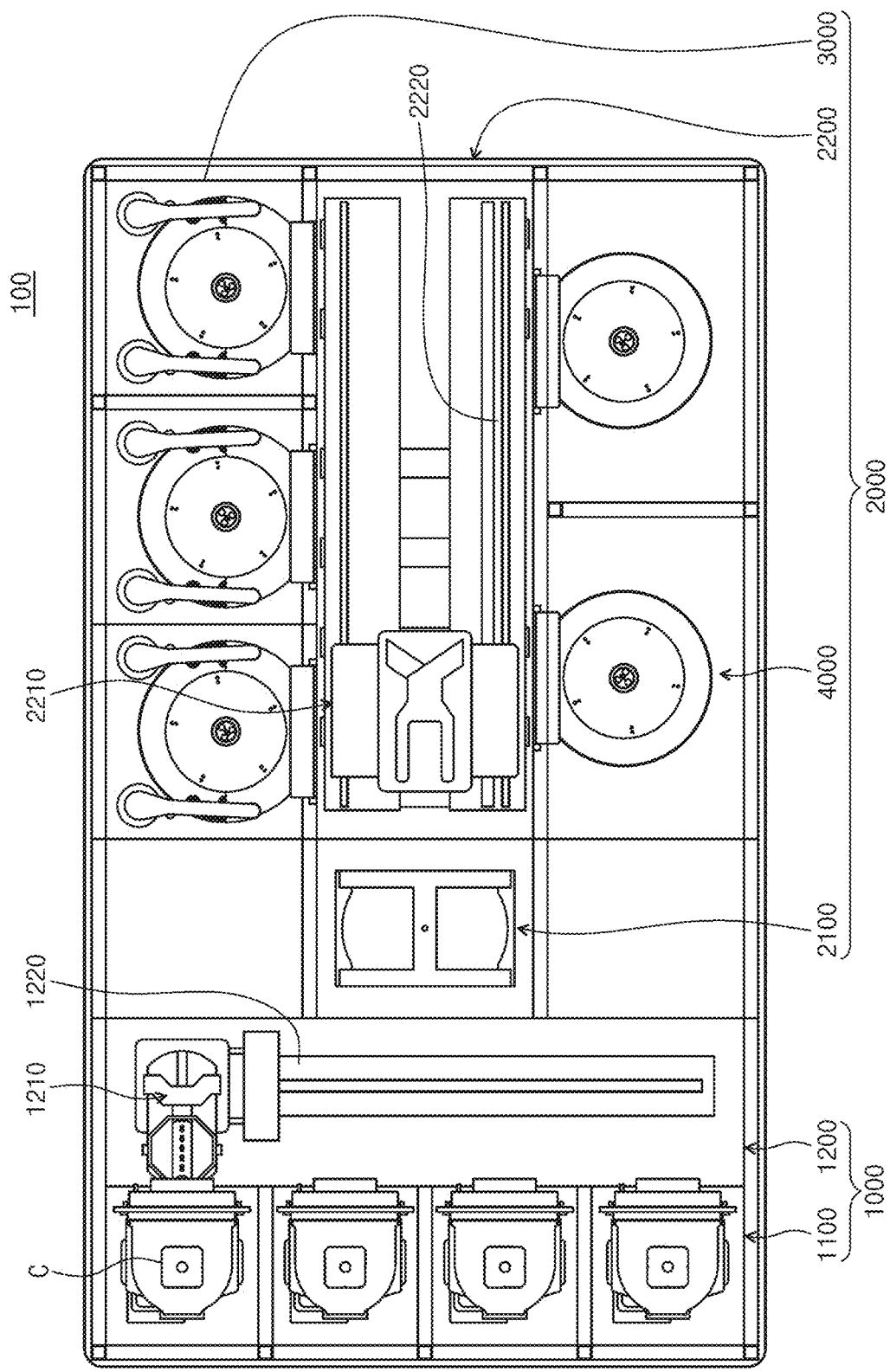
FIG. 1 is a plan view illustrating a substrate treating apparatus according to an embodiment of the inventive concept.

FIG. 1 is a plan view illustrating a substrate treating apparatus according to an embodiment of the inventive concept.

Referring to FIG. 1, the substrate processing apparatus 100 includes an index module 1000 and a process module 2000.

The index module 1000 receives a substrate S from the outside and transfers the substrate S to the process module 2000. The process module 2000 may perform a process using a supercritical fluid.

The index module 1000 is an equipment front end module (EFEM), and includes a load port 1100 and a feeding frame 1200.

A container C in which the substrate S is accommodated is positioned on the load port 1100. A front opening unified pod (FOUP) may be used as the container C. The container C may be carried into the load port 1100 from the outside by an overhead transfer, or may be carried out of the load port 1100.

The feeding frame 1200 transfers the substrate S between the container C positioned on the load port 1100 and the process module 2000. The feeding frame 1200 includes an index robot 1210 and an index rail 1220. The index robot 1210 may transfer the substrate S while moving on the index rail 1220.

The process module 2000 includes a buffer chamber 2100, a feeding chamber 2200, a first process chamber 3000, and a second process chamber 4000.

The buffer chamber 2100 provides a space in which the substrate S transferred between the index module 1000 and the process module 2000 temporarily stays. A buffer slot may be provided in the buffer chamber 2100. The substrate S is positioned in the buffer slot. For example, the index robot 1210 may extract the substrate S from the container C and may position the substrate S in the buffer slot. The feeding robot 2210 of the feeding chamber 2200 may extract the substrate S positioned in the buffer slot, and may transfer the substrate S to the first process chamber 3000 or the second process chamber 4000. A plurality of buffer slots may be provided in the buffer chamber 2100, and a plurality of substrates S may be positioned in the buffer slots.

The feeding chamber 2200 transfers the substrate S between the buffer chamber 2100 disposed at a circumference of the feeding chamber 2200, the first process chamber 3000, and the second process chamber 4000. The feeding chamber 2200 may include a feeding robot 2210 and a feeding rail 2220. The feeding robot 2210 may transfer the substrate S while moving on the feeding rail 2220.

The first process chamber 3000 and the second process chamber 4000 may perform a cleaning process. Then, the cleaning process may be sequentially performed by the first process chamber 3000 and the second process chamber 4000. For example, the first process chamber 3000 may perform a cleaning process, and subsequently, the second process chamber 4000 may perform a supercritical drying process. Further, the second process chamber 4000 may perform a cleaning process and a drying process.

The first process chamber 3000 and the second process chamber 4000 are disposed on side surfaces of the feeding chamber 2200. For example, the first process chamber 3000 and the second process chamber 4000 are disposed on different side surface of the feeding chamber 2200 to face each other.

The process module 2000 may include a plurality of first process chambers 3000 and a plurality of second process chambers 4000. The plurality of process chambers 3000 and 4000 may be disposed in a row on a side surface of the feeding chamber 2200, may be disposed to be stacked on one another, or may be disposed through a combination thereof.

Of course, the disposition of the first process chamber 3000 and the second process chamber 4000 is not limited to the aforementioned example, and may be changed in consideration of a footprint or a process efficiency of the substrate processing apparatus 100. The substrate treating apparatus 100 may be controlled by a controller 5000 (see FIG. 2).

Figure 2:
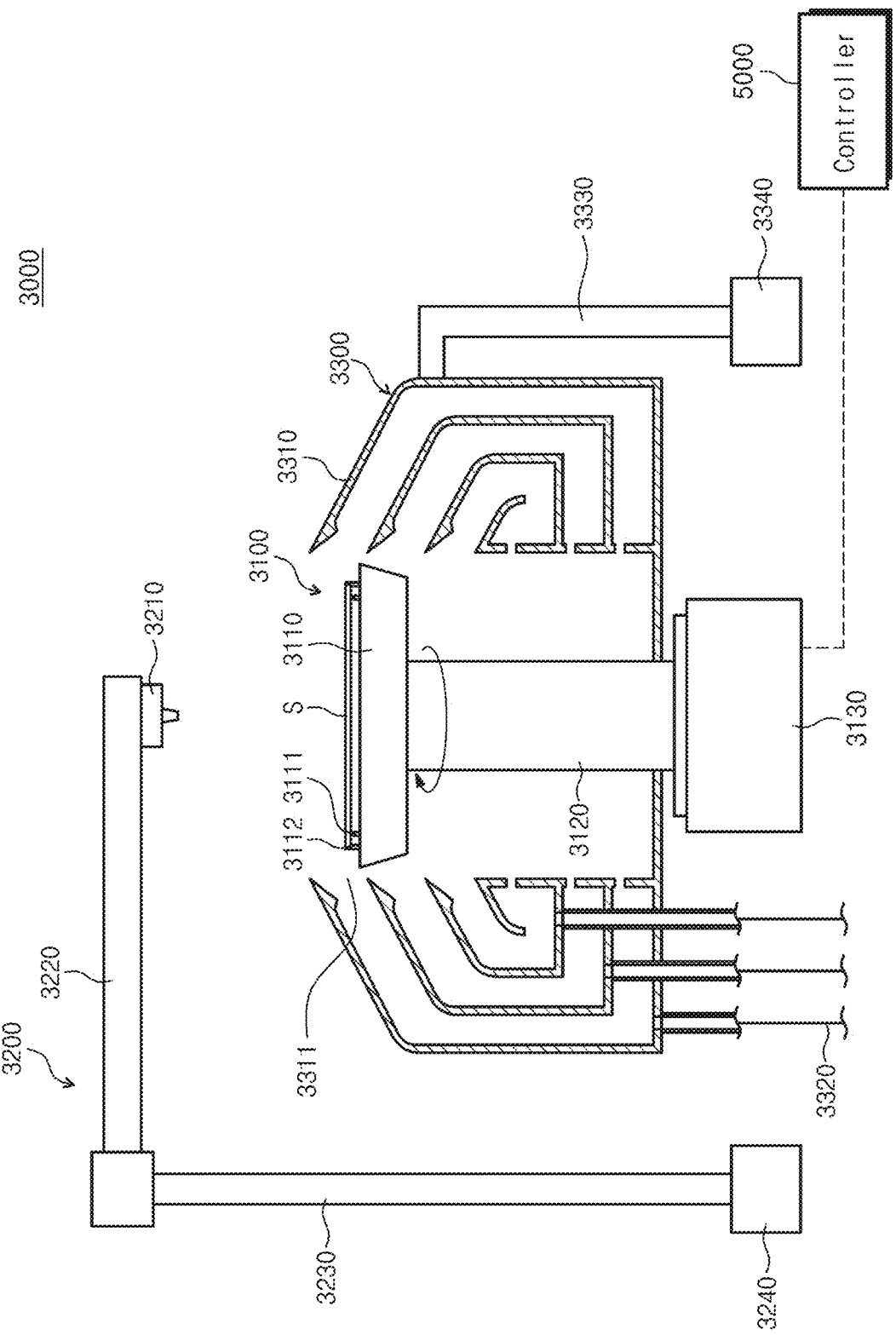
FIG. 2 is a sectional view of a first process chamber of FIG. 1.

FIG. 2 is a sectional view of a first process chamber of FIG. 1.

Referring to FIG. 2, the first process chamber 3000 includes a support member 3100, a nozzle member 3200, and a recovery member 3300.

The first process chamber 3000 may clean the substrate through a substrate cleaning composition. The process performed in the first process chamber 3000 is performed by an anhydrous process that does not use water. The conventional chemical, such as SC-1 or DHF, include water as a composition. The pattern formed in the substrate gradually becomes finer, and the line width of the pattern gradually becomes smaller. The water has a surface tension so that the penetration force into narrow spaces between the patterns is low, and accordingly, the cleaning efficiency for the spaces between the patterns is low. Further, in the cleaning using the conventional chemical, such as SC-1 or DHF, a drying process is performed after the chemical is substituted by deionized water, and pattern leaning or pattern collapsing may occur even in the drying process. Meanwhile, the substrate cleaning composition according to the inventive concept does not contain water, and accordingly, the conventional problem caused by the water contained in the chemical does not occur.

The support member 3100 supports the substrate S. The support member 3100 may rotate the supported substrate S. The support member 3100 includes a support plate 3110, a support pin 3111, a chuck pin 3112, a rotary shaft 3120, and a rotation driver 3130.

The support plate 3110 has an upper surface having a shape that is the same as or similar to the substrate S. A support pin 3111 and a chuck pin 3112 are formed on the upper surface of the support plate 3110. The support pin 3111 supports a bottom surface the substrate S. The chuck pin 3112 may fix the supported substrate S.

A rotary shaft 3120 is connected to a lower portion of the support plate 3110. The rotary shaft 3120 receives a rotational force from the rotation driver 3130 and rotates the support plate 3110. Accordingly, the substrate S positioned on the support plate 3110 may be rotated. The chuck pin 3112 prevents the substrate S from deviating from a proper location.

The nozzle member 3200 ejects a substrate cleaning composition to the substrate S. The nozzle member 3200 includes a nozzle 3210, a nozzle bar 3220, a nozzle shaft 3230, and a nozzle shaft driver 3240.

The nozzle 3210 ejects the substrate cleaning composition to the substrate S positioned on the support plate 3110. The nozzle 3210 is formed on the bottom surface of one end of the nozzle bar 3220. The nozzle bar 3220 is coupled to a nozzle shaft 3230. The nozzle shaft 3230 is provided to elevate or rotate. The nozzle shaft driver 3240 may adjust the location of the nozzle 3210 by elevating or rotating the nozzle shaft 3230.

The recovery member 3300 recovers the substrate cleaning composition supplied to the substrate S. If the substrate cleaning composition is supplied to the substrate S by the nozzle member 3200, the support member 3100 may uniformly supply the substrate cleaning composition to the entire area of the substrate S by rotating the substrate S. If the substrate S is rotated, the substrate cleaning composition spatters from the substrate S. The spattering substrate cleaning composition may be recovered by the recovery member 3300.

The recovery member 3300 may include a recovery vessel 3310, a recovery line 3320, an elevation bar 3330, and an elevation driver 3340.

The recovery vessel 3310 is provided to have an annular ring shape that surrounds the support plate 3110. A plurality of recovery vessels 3310 may be provided. The plurality of recovery vessels 3310 have a ring shape and sequentially become far away from the support plate 3110 when viewed from the top. The recovery vessels 3310 have larger heights as they go far away from the support plate 3110. A recovery hole 3311 through which the substrate cleaning composition spattering from the substrate S is formed in a space between the recovery vessels 3310.

A recovery line 3320 is formed on the lower surface of the recovery vessel 3310.

The elevation bar 3330 is connected to the recovery vessel 3310. The elevation bar 3330 receives power from the elevation driver 3340 and moves the recovery vessel 3310 upwards and downwards. When a plurality of recovery vessels 3310 are provided, the elevation bar 3330 may be connected to the outermost recovery vessel 3310. The elevation driver 3340 may select a recover hole 3311, through which the spattered substrate cleaning composition is introduced, from a plurality of recovery holes 3311 by elevating the recovery vessels 3310 through the elevation bar 3330 to adjust the recovery hole 3311.

The substrate cleaning composition according to an embodiment of the inventive concept includes a co-solvent, a binder, and an etching compound. A detailed description thereof will be made with reference to FIGS. 8 to 11.

Figure 3:
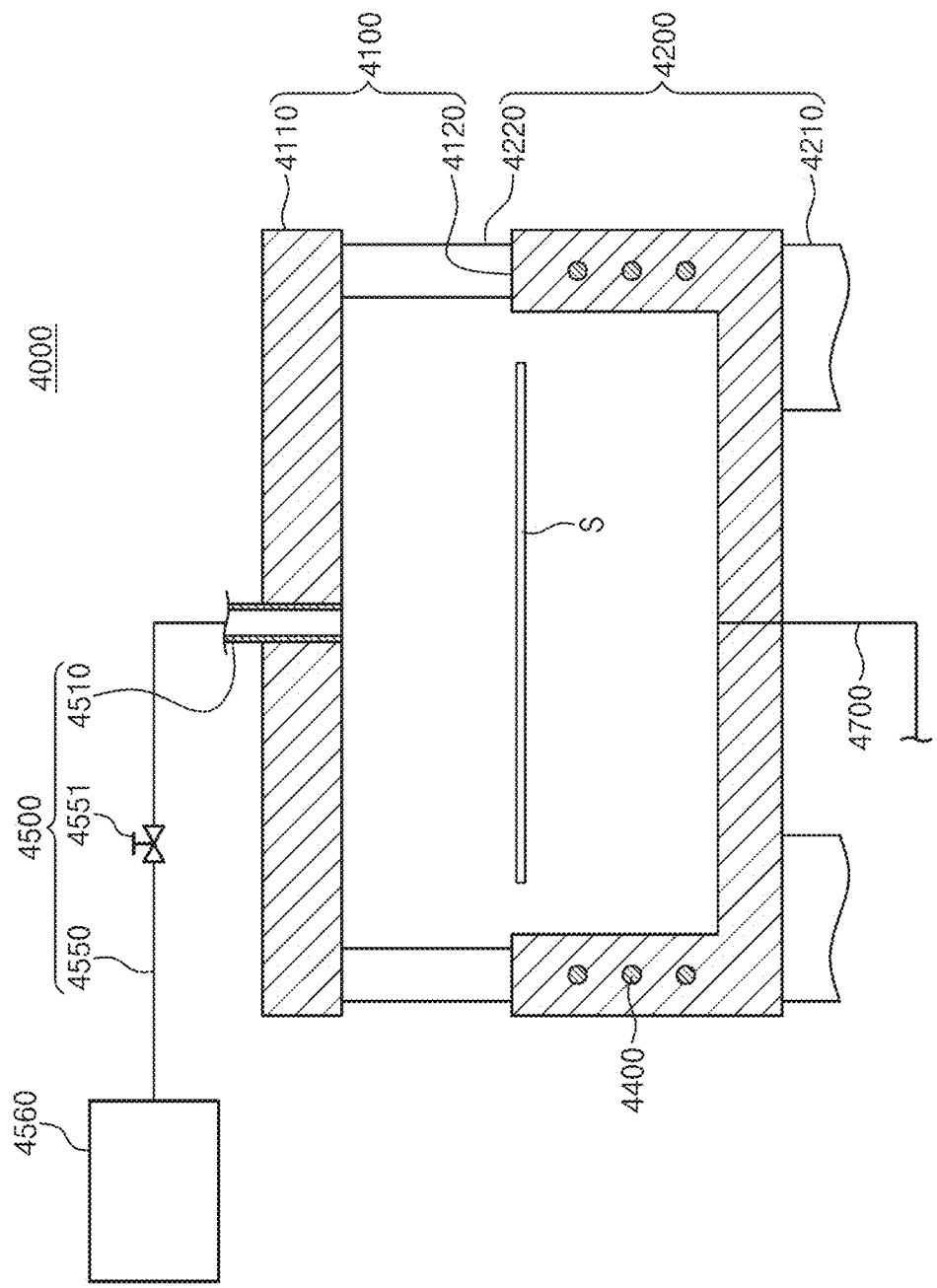
FIG. 3 is a sectional view of an embodiment of the second process chamber of FIG. 1.

FIG. 3 is a sectional view of an embodiment of the second process chamber of FIG. 1.

Referring to FIG. 3, the second process chamber (not illustrated) may include a chamber 4100, an elevation member 4200, a support unit 4300, a heating member 4400, a fluid supply unit 4500, a blocking member (not illustrated), and an exhaust member 4700. The second process chamber 4000 performs a process of treating a substrate by using a supercritical fluid.

The chamber 4100 provides a treatment space in which a supercritical process is performed, in the interior thereof. The chamber 4100 is formed of a material that endures a high pressure of more than a critical pressure.

The chamber 4100 includes an upper body 4110 and a lower body 4120. The lower body 4120 is coupled to the upper body 4110 under the upper body 4110. The space generated through combination of the upper body 4110 and the lower body 4120 is provided as a treatment space for performing a substrate treating process.

The upper body 4110 is fixedly installed in an external structure. The lower body 4120 is provided to be elevated with respect to the upper body 4110. If the lower body 4120 is lowered to be spaced apart from the upper body 4110, the treatment space is opened to the interior of the second process chamber 4000. Through the opened treatment space, the substrate S may be carried into or carried out of the interior space of the second process chamber 4000.

If the lower body 4120 is lifted to be attached to the upper body 4110, the treatment space is closed from the interior of the second process chamber 4000. In the closed treatment space, the substrate may be treated through the supercritical fluid. Unlike the above-described example, the lower body 4120 may be fixedly installed in the chamber 4100, and the upper body 4110 may be elevated.

The elevation unit 4220 elevates the lower body 4120. The elevation unit 4200 includes an elevation cylinder 4210 and an elevation rod 4220. The elevation cylinder 4210 is coupled to the lower body 4120 to generate a vertical driving force. While the substrate is treated by using the supercritical fluid, the elevation cylinder 4210 generates a driving force that is high enough to seal the second process chamber 4000 by overcoming a high pressure of a threshold pressure or more in the interior of the second process chamber 4000 and attaching the upper body 4110 and the lower body 4120. One end of the elevation rod 4220 is inserted into the elevation cylinder 4210 and extends vertically upwards, and an opposite end of the elevation rod 4220 is coupled to the upper body 4110. If a driving force is generated in the elevation cylinder 4210, the elevation cylinder 4210 and the elevation rod 4220 may be relatively elevated, and the lower body 4120 coupled to the elevation cylinder 4210 also may be elevated. When the lower body 4120 is elevated by the elevation cylinder 4210, the elevation rod 4220 may prevent the upper body 4110 and the lower body 4120 from moving horizontally and guide the elevation direction of the lower body 4120, thereby preventing the upper body 4110 and the lower body 4120 from deviating from a proper location.

The support unit (not illustrated) is located in the treatment space of the chamber 4100 to support the substrate S. The support unit (not illustrated) is coupled to the upper body 4110 or the lower body 4220.

The support unit (not illustrated) may contact a peripheral area of the substrate S to support the substrate S. So that treatment of the substrate S through the supercritical fluid may be performed on an entire area of the upper surface of the substrate S and almost all area of the lower surface of the substrate S. Here, the upper surface of the substrate S may be a pattern surface, and the lower surface of the substrate S may be a non-pattern surface.

The heating member 4400 heats the interior of the second process chamber 4000. The heating member 4400 heats the supercritical fluid supplied to the second process chamber 4000 to a critical temperature or higher to maintain a phase of the supercritical fluid. When the supercritical fluid is liquefied, the heating member 4400 may heat the supercritical fluid such that the liquefied supercritical fluid is converted into a supercritical fluid again. The heating member 440 is buried in at least one wall of the upper body 4110 and the lower body 4120. The heating member 4400 receives electric power from the outside to generate heat. As an example, the heating member 4400 may be a heater.

The fluid supply unit 4500 supplies a fluid to the second process chamber 4000. The supplied fluid may be a supercritical fluid. As an example, the supplied supercritical fluid may be carbon dioxide. Further, the fluid supply unit 4500 may mix the supercritical fluid and the substrate cleaning composition to supply the mixture.

The fluid supply unit 4500 includes a fluid supply unit 4510, a supply line 4550, and valves 4551.

The fluid supply port 4510 connected to the upper body 4110 directly supplies the supercritical fluid to the upper surface of the substrate S. The fluid supply port 4510 further comprises a lower fluid supply port (not illustrated) connected to the lower body 4120. The supercritical fluid ejected from the fluid supply port 4510 reaches a central area of the substrate S and is uniformly provided to the whole area of the substrate S while being spread out to a peripheral area of the substrate S.

The supply line 4550 is connected to the fluid supply port 4510. The supply line 4550 receives supercritical fluid from the supercritical fluid reservoir 4560 to supply supercritical fluid to the fluid supply port 4510. For an embodiment, the supercritical fluid reservoir 4560 may store and supply supercritical fluid, which may be carbon dioxide.

The valve 4551 is installed in the supply line 4550. A plurality of valves 4551 may be provided in the supply line 4550. Each valve 4551 regulates the flow rate of the supercritical fluid supplied to the fluid supply port 4510. The valve 4551 is capable of controlling the flow rate of the supercritical fluid supplied to the inside of the chamber 4100 by the controller 5000.

The blocking member (not illustrated) prevents the supercritical fluid supplied from the fluid supply port 4500 from being directly ejected to the substrate S. The blocking member (not illustrated) is located in the treatment space in the interior of the chamber 4100. The blocking member (not illustrated) is disposed between the support unit (not illustrated) and the fluid supply port 4510. The blocking member (not illustrated) may have a circular plate shape.

The exhaust member 4700 exhausts the supercritical fluid from the second process chamber 4000. The exhaust member 4700 may be connected to the exhaust line 4750 that exhausts the supercritical fluid. Then, a valve (not illustrated) for adjusting the flow rate of the supercritical fluid exhausted to the exhaust line 4750 may be installed in the exhaust member 4700 The supercritical fluid exhausted through the exhaust line 4750 may be discharged to the air or may be supplied to a supercritical fluid recycling system (not illustrated). The exhaust member 4700 may be coupled to the lower body 4120.

At an late stage of the substrate treating process using the supercritical fluid, the supercritical fluid may be exhausted from the second process chamber 4000 so that the internal pressure of the second process chamber 4000 may be reduced to a critical pressure or lower and the supercritical fluid may be liquefied. The liquefied supercritical fluid may be discharged by the gravitational force through the exhaust member 4700 formed in the lower body 4120.

Figure 4:
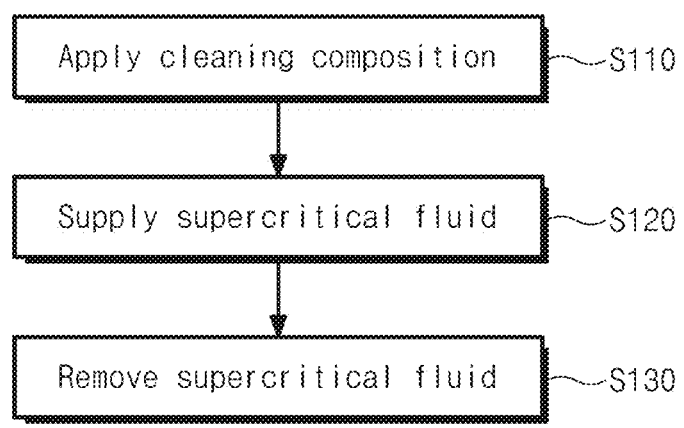
FIG. 4 is a view illustrating an operation of treating a substrate by using an substrate cleaning composition according to another embodiment.

FIG. 4 is a view illustrating an operation of treating a substrate by using a substrate cleaning composition according to another embodiment.

Referring to FIG. 4, a present amount of substrate cleaning composition is applied onto the upper surface of the substrate S (S110). The substrate cleaning composite may be applied in the first process chamber 3000. Then, the support member 3100 may be stopped or rotated. Thereafter, the substrate S carried into the second process chamber 400 while the substrate cleaning composite resides on the upper surface of the substrate S, and the supercritical fluid is supplied to the substrate S (S120). The supercritical fluid may be a carbon dioxide.

If the substrate cleaning composition meets the supercritical fluid, it is dissolved in the supercritical fluid. If the solvent is alcohol, a degree by which the substrate cleaning composition is dissolved in the supercritical fluid may be improved. If the substrate cleaning composition is provided to a vicinity of the upper surface of the substrate S in a state in which the substrate cleaning composition is dissolved in the supercritical fluid, a penetration force of the substrate cleaning composition into a narrow space increases. Accordingly, the cleaning of the substrate is effectively performed on the pattern formed in the substrate as well as a surface of the substrate S.

If a preset time elapses, the supercritical fluid dissolved in the substrate cleaning composition is removed from the vicinity of the substrate S (S130). Then, the particles and the substrate cleaning composite are removed together with the supercritical fluid around the substrate S.

Figure 5:
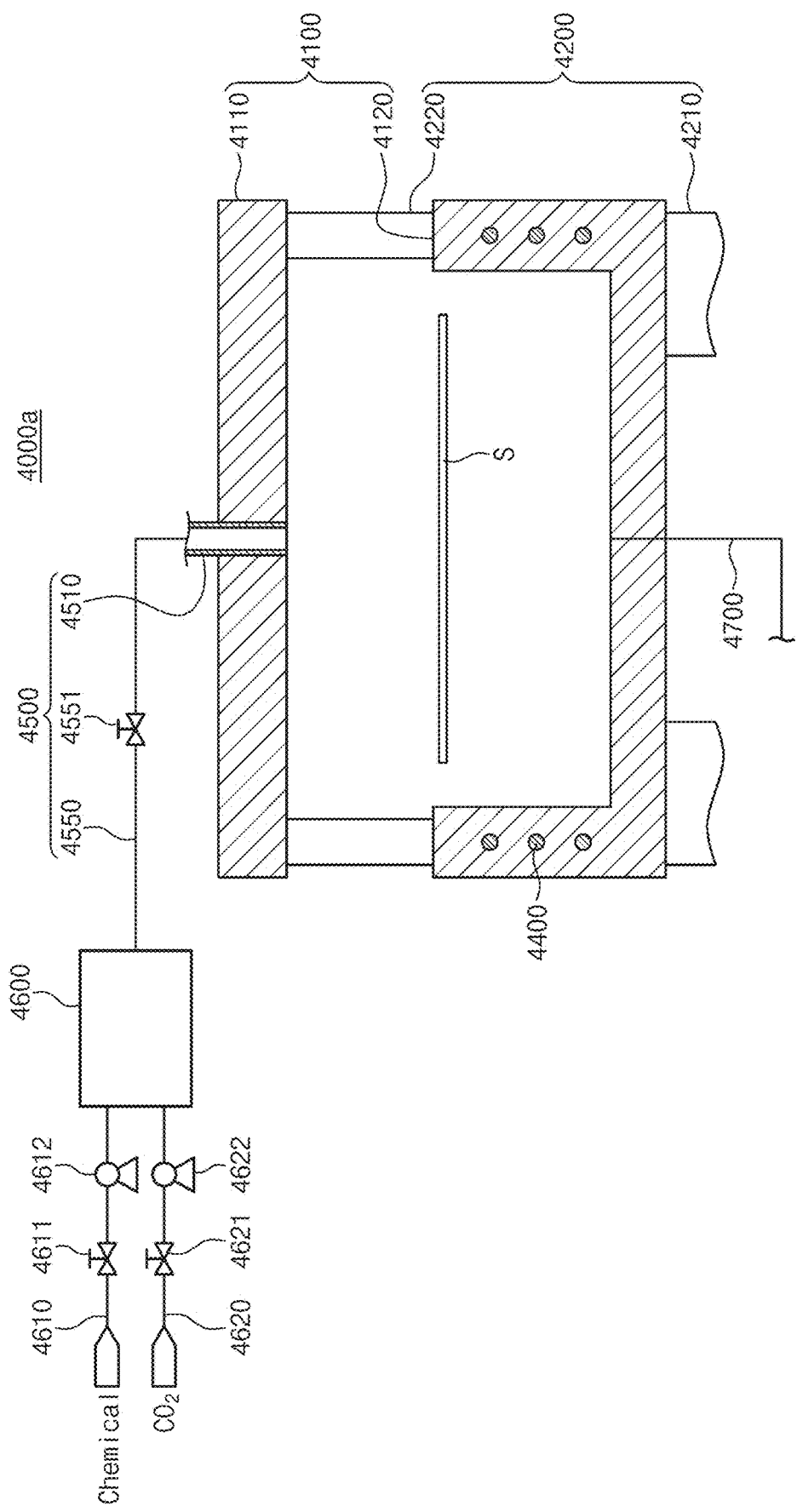
FIG. 5 is a view illustrating a second process chamber according to another embodiment.

FIG. 5 is a view illustrating a second process chamber 4000a according to another embodiment. A configuration that is different from that of FIG. 3 will be described with reference to FIG. 5.

The second process chamber 4000a includes a mixing tank 4600. The mixing tank 4600 mixes the supercritical fluid and the substrate cleaning composition. The supercritical fluid and the substrate cleaning composition mixed in the mixing tank 4600 are supplied to the treatment space through the supply line 4550.

The mixing tank 4600 is connected to the first fluid supply line 4610, through which the substrate cleaning composition is supplied. Further, the mixing tank 4600 is connected to the second supply line 4620, through which the supercritical fluid or a raw material fluid (for example, carbon dioxide) thereof. A valve 4611 and a pump 4612 are installed in the first fluid supply line 4610. Further, a valve 4621 and a pump 4622 are installed in the second fluid supply line 4620.

Figure 6:
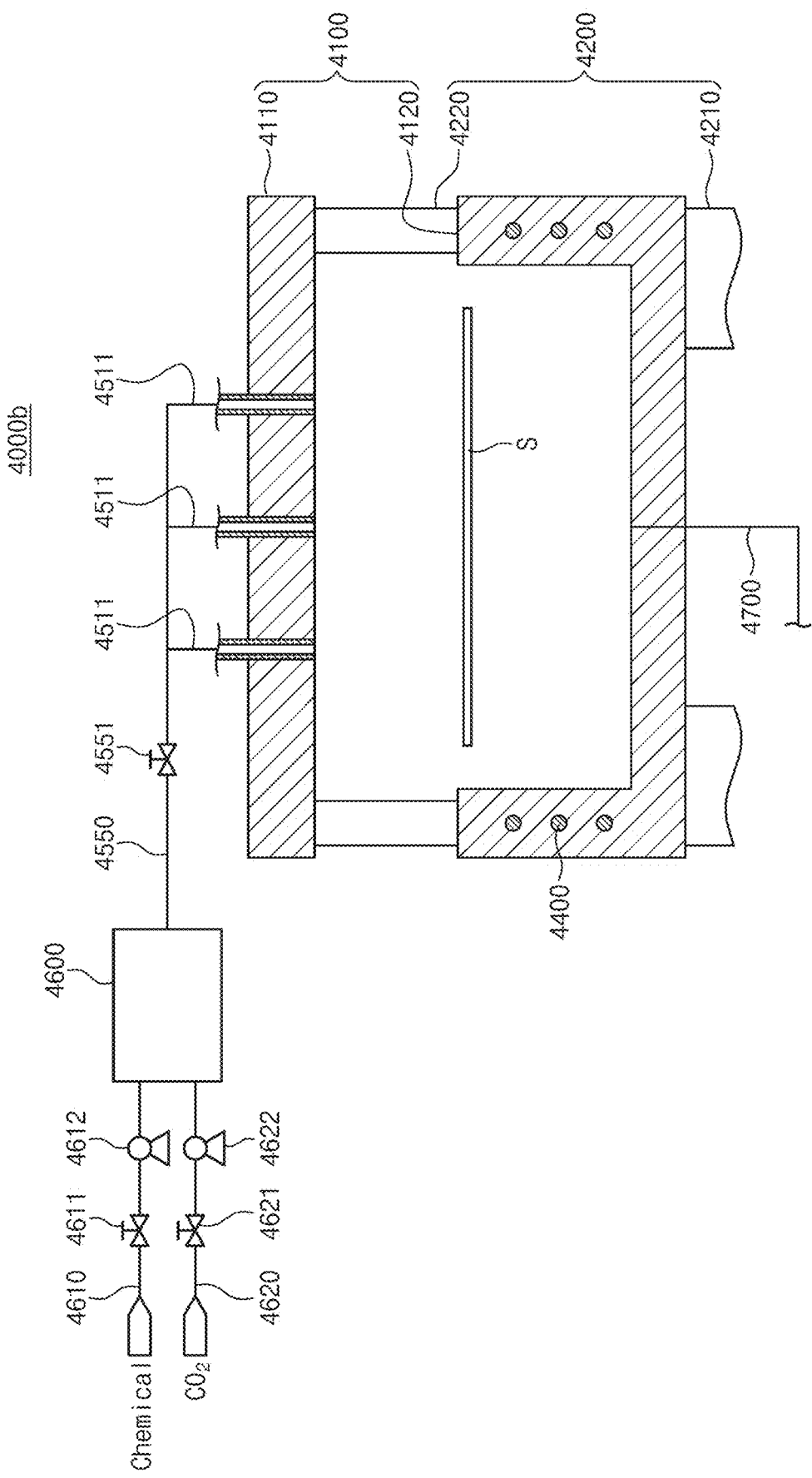
FIG. 6 is a view illustrating a second process chamber according to another embodiment.

FIG. 6 is a view illustrating a second process chamber 4000b according to another embodiment.

Referring to FIG. 6, the second process chamber 4000b is provided with a plurality of fluid supply ports 4511. The plurality of fluid supply ports 4511 are connected to the upper body 4110 of the chamber 4100 and supplies the supercritical fluid or the mixture fluid of the supercritical fluid and the substrate cleaning composition to the upper side of the interior space of the chamber 4110.

The plurality of fluid supply ports 4511 are arranged at locations that face the substrate S at a preset interval. As an example, any one of the plurality of fluid supply ports 4511 may be located at a location corresponding to the central upper surface of the substrate S, and the remaining ones of the plurality of fluid supply ports 4511 may be located at a circumference of the substrate S. Accordingly, the supercritical fluid or the mixture treatment liquid of the supercritical fluid and the substrate cleaning composition, which is supplied to the substrate S, is uniformly supplied to all areas of the substrate to improve a cleaning/drying efficiency or a cleaning efficiency.

The configuration of the second process chamber 4000b, except for the plurality of fluid supply ports 4511, is the same as that of the second process chamber 4000a of FIG. 5.

Figure 7:
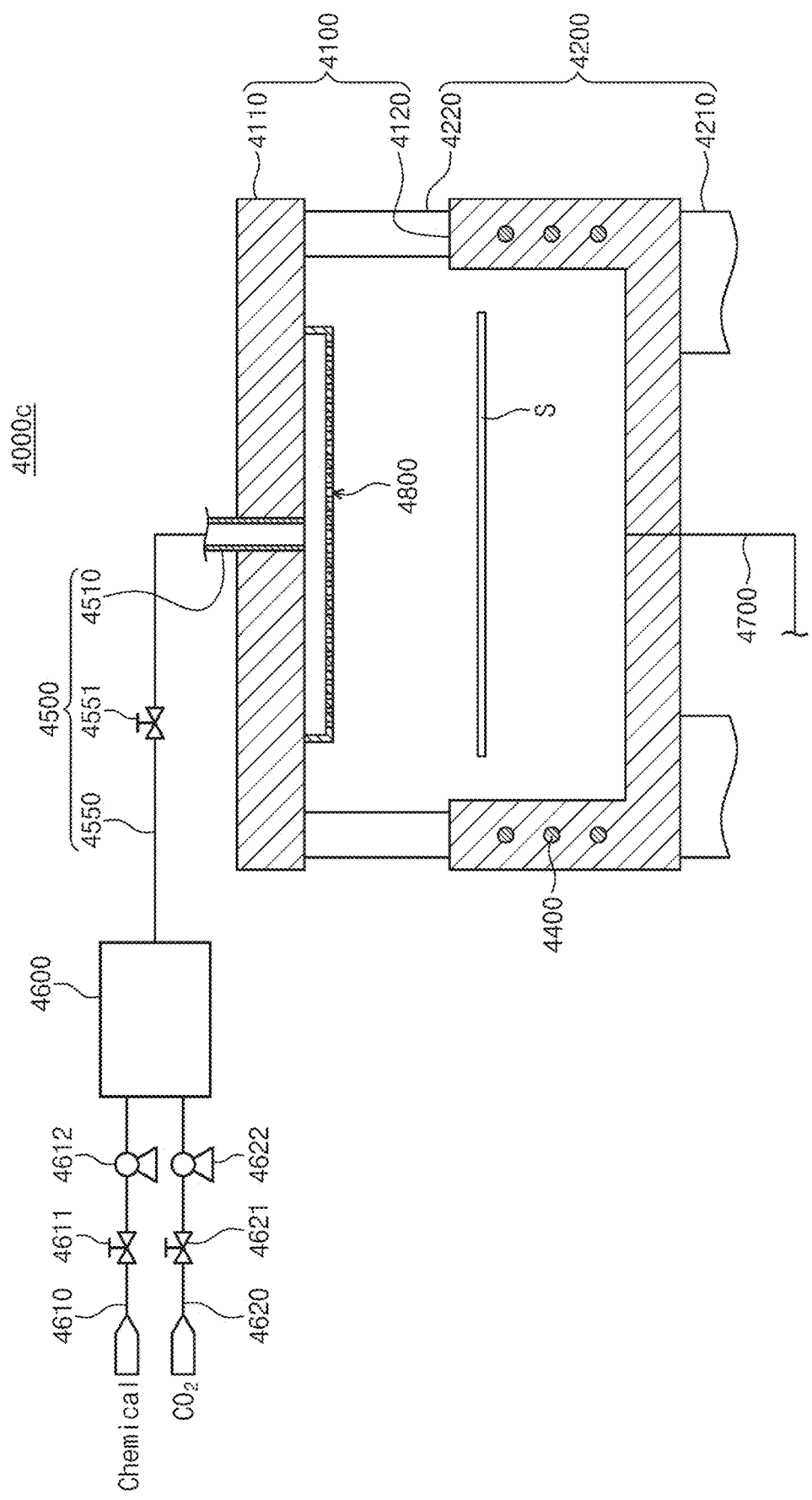
FIG. 7 is a view illustrating a second process chamber according to another embodiment.

FIG. 7 is a view illustrating a second process chamber according to another embodiment.

Referring to FIG. 7, a shower head 4800 is provided on an upper side of an interior space of the chamber 4100. The shower head 4800 may be fixed to a bottom surface of the upper body 4110 to be located above the substrate S. A space in which the supercritical fluid or a mixture treatment liquid of the supercritical fluid and the substrate cleaning composition, which has been supplied to the fluid supply port 4510, is temporarily accommodated is formed between the shower head 4800 and the bottom surface of the upper body 4110. The shower head 4800 has holes, through which the supercritical fluid supplied into a space between the shower head 4800 and the bottom surface of the upper body 4110 is supplied toward the substrate. The supercritical fluid supplied to the substrate S is uniformly supplied to all the areas of the substrate S through the shower head to improve a cleaning/drying efficiency or a cleaning efficiency.

The configuration of the second process chamber 4000b, except for the shower head 4800, is the same as that of the second process chamber 4000a of FIG. 5 or the second process chamber 4000b of FIG. 6.

Figure 8:
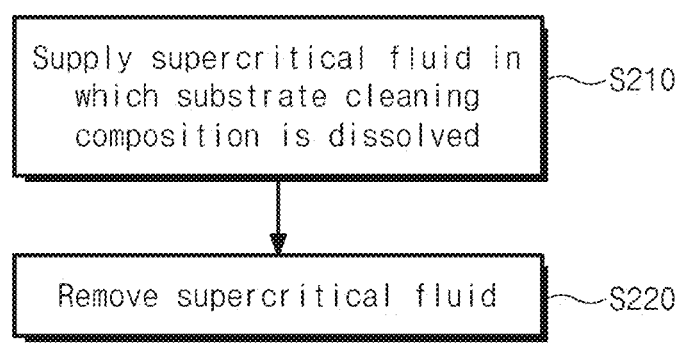
FIG. 8 is a view illustrating an operation of treating a substrate by using a substrate cleaning composition according to an embodiment of the inventive concept.

FIG. 8 is a view illustrating an operation of treating a substrate by using an substrate cleaning composition according to an embodiment of the inventive concept.

The supercritical fluid in which the substrate cleaning composition according to an embodiment is dissolved may be supplied from the second process chamber 4000a to the substrate S (S210). In detail, the mixing tank 4600 may supply the supercritical fluid in which the substrate cleaning composition is dissolved to the chamber 4100. The supercritical fluid in which the substrate cleaning composite is dissolved reacts with the substrate S to remove particles from the substrate S. If the substrate cleaning composite is provided to a periphery of the upper surface of the substrate S while being dissolved in the supercritical fluid, the penetration force of the substrate cleaning composite into a narrow space increases. Accordingly, the cleaning of the substrate is effectively performed on the pattern formed in the substrate as well as a surface of the substrate S.

Further, if a preset time elapses and the substrate S is cleaned, the supplied supercritical fluid may be removed around the substrate S (S220).

A process fluid used in the first process chamber 3000 and the second process chamber 4000 will be described in the following. As described above, the substrate cleaning composition and the supercritical fluid are provides as the process chamber.

The substrate cleaning composition according to an embodiment includes a co-solvent and a binder. Optionally, the substrate cleaning composition further includes an etching compound. FIG. 9 illustrates an experiment of identifying a performance of a substrate cleaning composition. The composition will be described in detail with reference to FIG. 9.

The co-solvent according to an embodiment is alcohol, and the alcohol is isopropyl alcohol, methanol, or ethanol. The co-solvent may dissolve trimethyl phosphate and an etching compound. The co-solvent makes the substrate cleaning composite affinitive to the supercritical fluid. The co-solvent allows the substrate cleaning composite to be effectively dissolved in the supercritical fluid if the substrate cleaning composite meets the supercritical fluid. In an experimental example, isopropyl alcohol (IPA) is selected as the co-solvent.

The etching compound according to an embodiment is a fluoride compound. In the experimental example, a hydrogen fluoride (HF) solution is selected.

The binder according to an embodiment is a compound of chemical formula 1, dimethyl sulfite, or diethyl sulfite. As an example of chemical formula 1, trimethyl phosphate, triethyl phosphate, or trimbutyl phosphate.

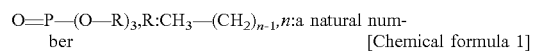

O=P—(O—R)$_3$,R:CH$_3$—(CH$_2$)$_{n-1}$,n:a natural number       [Chemical formula 1]

Korean Patent Application Publication No. 10-2018-0036263 (This publication was unpublished on the date the original application was filed.) provides isopropoxy ethanol that acts as a binder, and acetic anhydride, acetic acid or propylene carbonate for preventing the substrate from being adsorbed again. When residues of the substrate are removed, for example, the particles generated by SiO2 or Si3N4 are removed from the surface of the substrate, the binder is coupled to the particles and a re-adsorption preventing agent prevents the particles from being adsorbed to the substrate again to clean the substrate.

The binder according to an embodiment of the inventive concept acts as the binder and the re-adsorption preventing agent. The binder provided as an embodiment of the inventive concept is located on outer surfaces of the particles to form micelles. As the micelles are formed, the particles may be prevented from contacting the substrate to be prevented from being attached to the substrate again in the process of cleaning the substrate.

The experimental example of FIG. 9 is a comparison example of performing functions of the binder and the re-adsorption preventing agent, and tris(2-butoxyethyl) phosphate as a comparison example and trimethyl phosphate as an embodiment are compared.

Comparison Example 1

A substrate was treated by using a substrate cleaning composition obtained by mixing IPA and tris(2-butoxyethyl) phosphate at a weight ratio of 1:1. After the treated substrate was observed with an optical microscope, it was observed that the substrate was inversely contaminated and the particles are not removed when the substrate was treated.

Comparison Example 1

A substrate was treated by using an a substrate cleaning composition obtained by mixing an HF solution, IPA, and tris(2-butoxyethyl) phosphate at a weight ratio of 1:20:10.5. After the treated substrate was observed with an optical microscope, it was observed that the substrate was inversely contaminated and the particles are not removed when the substrate was treated.

Embodiment 1

A substrate was treated by using an a substrate cleaning composition obtained by mixing IPA and trimethyl phosphate at a weight ratio of 1:1. After the treated substrate was observed with an optical microscope, it was observed that the particles were removed. The particles are removed only with a mixture liquid of trimethyl phosphate and a co-solvent without using additional compound.

Embodiment 2

A substrate was treated by using an a substrate cleaning composition obtained by mixing an HF solution, IPA, and trimethyl phosphate at a weight ratio of 0.5:1. After the treated substrate was observed with an optical microscope, it was observed that the particles ware removed better than in embodiment 1. It was identified that particle removal efficiency became higher than in embodiment 1 by adding a fine amount of HF solution.

Comparison of Performances According to Composition Ratios of HF Solution and Trimethyl Phosphate FIG. 10 compares performances while varying composition ratios of an HF solution and trimethyl phosphate.

Embodiment 3

The substrate was treated by a mixture obtained by mixing an HF solution and trimethyl phosphate at a weight ratio of 1:25. The treated substrate was observed with an optical microscope and an SEM. In embodiment 3, it was identified that particle removal efficiency (PRE) was 50%.

Embodiment 4

The substrate was treated by a mixture obtained by mixing an HF solution and trimethyl phosphate at a weight ratio of 01:10:00. The treated substrate was observed with an optical microscope and an SEM. In embodiment 4, it was identified that particle removal efficiency was 90%. However, in embodiment 4, it was observed that loss of membranes of 0.6 nm was generated.

Comparison of Performances According to Composition Ratios of HF Solution, IPA, and Trimethyl Phosphate FIG. 11 compares performances while varying composition ratios of an HF solution, IPA, and trimethyl phosphate. In embodiments 6, 7, 8, and 9, the weight percent of the HF solution was fixed to 0.5 wt %. Because the HF solution generates loss of membranes, the loss was minimized.

Embodiment 6

A HF solution of 0.5 wt %, IPA, and trimethyl phosphate were mixed at a weight ratio of 20:1. When the treated substrate was observed with an optical microscope, it was observed that PRE was 75%.

Embodiment 7

A HF solution of 0.5 wt %, IPA, and trimethyl phosphate were mixed at a weight ratio of 10:1. When the treated substrate was observed with an optical microscope and an SEM, it was observed that PRE was 78%.

Embodiment 8

A HF solution of 0.5 wt %, IPA, and trimethyl phosphate were mixed at a weight ratio of 5:1. When the treated substrate was observed with an optical microscope and an SEM, it was observed that PRE was 80%.

Embodiment 9

A HF solution of 0.5 wt %, IPA, and trimethyl phosphate were mixed at a weight ratio of 1:1. When the treated substrate was observed with an optical microscope and an SEM, it was observed that PRE was 85%.

Comparison Example

Although not illustrated in the table of FIG. 11, when the portion of the IPA in the weight ratio of IPA and trimethyl phosphate was larger than that in embodiment 6, the particles were not effectively removed. Further, when the portion of IPA in the weight ratio of IPA and trimethyl phosphate was smaller than in embodiment 9, it was identified that the substrate cleaning composition was not dissolved in the supercritical fluid but extracted so that inverse contamination was generated.

The optimum embodiment of the substrate cleaning composition derived through the experiments is to mix a HF solution of 0.5 wt %, IPA, and trimethyl phosphate at a weight ratio of 1:1. The suggested numeric range does not mean that it is mathematically accurate but an error range that may be generally generated and a numeric change in a common consideration capability are included in the numeric range.

According to an embodiment of the inventive concept, a substrate cleaning composite, a substrate treating apparatus and a substrate treating method, that efficiently treats a substrate, may be provided.

According to an embodiment of the inventive concept, a substrate cleaning composite, a substrate treating apparatus and a substrate treating method, having an improved cleaning efficiency, may be provided.

According to an embodiment of the inventive concept, a substrate cleaning composite a substrate treating apparatus and a substrate treating method, that prevents a pattern leaning and collapse, may be provided.

According to an embodiment of the inventive concept, particles having sizes of nanoscales (not more than 100 nm).

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate cleaning composition for treating a substrate, comprising:
   a co-solvent; and
   a binder comprising a trimethyl phosphate;
   wherein a weight percent of the co-solvent is 45 to 97 wt %, and a weight percent of the trimethyl phosphate is 3 to 55 wt %.

2. A substrate cleaning composition for treating a substrate, comprising:
   a co-solvent;
   a binder comprising a compound of chemical formula 1, dimethyl sulfite, diethyl sulfite, or a combination thereof and
   an etching compound including fluorine;
   wherein a weight percent of the etching compound is 0.1 to 1 wt %, a weight percent of the co-solvent is 45 to 97 wt %, and a weight percent of the binder is 3 to 55 wt %

$$O=P-(O-R)_3, R:CH_3-(CH_2)_{n-1}, n: \text{a natural number.} \quad \text{[Chemical formula 1]}$$

3. A substrate cleaning composition for treating a substrate, comprising:
   a co-solvent;
   a binder comprising a compound of chemical formula 1, dimethyl sulfite, diethyl sulfite, or a combination thereof; and
   an etching compound including fluorine;
   wherein a weight percent of the etching compound is less than 1 wt %, and a weight ratio of the co-solvent and the binder is 1:1

$$O=P-(O-R)_3, R:CH_3-(CH_2)_{n-1}, n: \text{a natural number.} \quad \text{[Chemical formula 1]}$$

4. A substrate cleaning composition that is mixed with a supercritical fluid to be supplied, comprising:
   the substrate cleaning composition is an anhydrous composition comprising a binder comprising a compound of chemical formula 1, dimethyl sulfite, diethyl sulfite, or a combination thereof $$O=P-(O-R)_3, R:CH_3-(CH_2)_{n-1}, n: \text{a natural number.} \quad \text{[Chemical formula 1]}$$

5. The substrate cleaning composition of claim 4, wherein the binder is trimethyl phosphate.

6. The substrate cleaning composition of claim 4, further comprising: an etching compound including fluorine.

7. The substrate cleaning composition of claim 6, wherein the etching composite includes hydrogen fluoride.

8. The substrate cleaning composition of claim 4, wherein a co-solvent dissolving the binder is alcohol.

9. The substrate cleaning composition of claim 4, wherein a co-solvent dissolving the binder is isopropyl alcohol, methanol, ethanol, or a combination thereof.

10. The substrate cleaning composition of claim 4, wherein a weight percent of a co-solvent dissolving the binder is 45 to 97 wt % and a weight percent of the binder is 3 to 55 wt %.

11. The substrate cleaning composition of claim 6, wherein a weight percent of the etching compound is 0.1 to 1 wt %, a weight percent of a co-solvent dissolving the binder is 45 to 97 wt %, and a weight percent of the binder is 3 to 55 wt %.

12. The substrate cleaning composition of claim 6, wherein a weight percent of the etching compound is less than 1 wt %, and a weight ratio of the binder and a co-solvent dissolving the binder is 1:1.

13. The substrate cleaning composition of claim 4, wherein the substrate cleaning composition removes particles of sizes of nanoscales (not more than 100 nm).

14. A substrate treating method comprising:
    supplying the substrate cleaning composition of claim 1 to a substrate; and
    treating the substrate by supplying a supercritical fluid to the substrate.

15. A substrate treating apparatus comprising:
    a chamber;
    a support unit located inside the chamber and configured to support a substrate; and
    a fluid supply unit configured to mix a substrate cleaning composite with a supercritical fluid and supply the mixture into the chamber,
    wherein the substrate cleaning composition is the substrate cleaning composition of claim 1.

16. The substrate treating apparatus of claim 15, wherein the fluid supply unit comprises:
    a plurality of fluid supply ports connected to the chamber and configured to supply the cleaning composition and the supercritical fluid to an inner space of the chamber.

17. The substrate treating apparatus of claim 15, wherein the fluid supply unit comprises:
    a fluid supply port connected to the chamber and configured to supply the substrate cleaning composition and the supercritical fluid to an interior space of the chamber; and
    a shower head located above the substrate in the interior space of the chamber and configured to distribute the cleaning composition and the supercritical fluid to the substrate.

* * * * *